United States Patent [19]
Russell

[11] Patent Number: 5,436,871
[45] Date of Patent: Jul. 25, 1995

[54] OPTICAL RANDOM ACCESS MEMORY HAVING FOLDED IMAGE

[75] Inventor: James T. Russell, Bellevue, Wash.

[73] Assignee: Information Optics Corporation, Issaquah, Wash.

[21] Appl. No.: 272,112

[22] Filed: Jul. 7, 1994

Related U.S. Application Data

[63] Continuation-in-part of Ser. No. 815,924, Dec. 30, 1991, and a continuation-in-part of PCT/US92/11356, Dec. 30, 1992.

[51] Int. Cl.$^6$ .................... G11B 7/00; G11C 11/42
[52] U.S. Cl. ................... 365/234; 369/44.37; 369/44.38; 369/44.39; 369/109; 369/112
[58] Field of Search ............ 365/234; 369/44.37, 369/44.38, 44.39, 109, 112

[56] References Cited

U.S. PATENT DOCUMENTS

| | | |
|---|---|---|
| 3,191,157 | 6/1965 | Parker et al. . |
| 3,637,307 | 1/1972 | Spitz . |
| 3,656,120 | 4/1972 | Maure . |
| 3,676,864 | 7/1972 | Maure et al. . |
| 3,704,068 | 11/1972 | Waly . |
| 3,765,749 | 10/1973 | LaMacchia . |
| 3,806,643 | 4/1974 | Russell . |
| 3,860,917 | 1/1975 | Auria . |
| 3,885,094 | 5/1975 | Russell . |
| 3,898,005 | 8/1975 | Roberts . |
| 3,899,778 | 8/1975 | Roberts . |
| 3,952,290 | 4/1976 | Williams . |
| 3,996,570 | 12/1976 | Roberts . |
| 4,021,606 | 5/1977 | Takeda et al. . |
| 4,227,212 | 10/1980 | Woolfson et al. . |
| 4,466,088 | 8/1984 | Trethewey ........................ 369/46 |
| 4,663,738 | 5/1987 | Sprague . |
| 4,682,861 | 7/1987 | Hosoya . |
| 4,727,533 | 2/1988 | Erbert . |
| 4,743,091 | 5/1988 | Gelbart . |
| 4,745,417 | 5/1988 | Inokuchi . |
| 4,794,245 | 12/1988 | Auer . |
| 4,899,224 | 2/1990 | Ooba et al. . |
| 4,988,153 | 1/1991 | Paek . |
| 5,007,690 | 4/1991 | Chern et al. . |
| 5,013,107 | 5/1991 | Biles . |
| 5,113,378 | 5/1992 | Kimura ........................ 369/44.37 |
| 5,138,604 | 8/1992 | Umeda et al. . |

FOREIGN PATENT DOCUMENTS 1188220  12/1968  United Kingdom .

Primary Examiner—Viet Q. Nguyen
Attorney, Agent, or Firm—Graybeal Jackson Haley & Johnson

[57] ABSTRACT

A compact optical memory in which data is stored in an optical data layer capable of selectively altering light such as by changeable transmissivity, reflectivity, polarization, and/or phase. The data is illuminated by controllable light sources and an array of multi-surface diffractive imaging lenslets cause a data image to be projected onto an array of light sensors by reflecting, hence folding the image rays, by means of a mirror that both reflects and optically modifies the light rays to redirect them onto the sensor array located substantially coplanar with the data layer. Data is organized into an annular array of patches (called pages). By selective illumination of each data page, one of the lenslets images the selected data page onto a central image plane where the sensor array is located. Light in the data image pattern strikes different ones of the arrayed light sensors, thereby outputting a pattern of binary bits in the form of electrical data signals. By selectively and sequentially illuminating different ones of the data regions (pages) on the data layer, correspondingly different data patterns are imaged by the corresponding lenslets onto the common sensor array, thereby enabling many stored data images to be retrieved by multiplexing at electro-optical speed.

10 Claims, 7 Drawing Sheets

OPTICAL RANDOM ACCESS MEMORY HAVING FOLDED IMAGE

CROSS REFERENCE TO RELATED APPLICATIONS

This is a continuation-in-part of U.S. patent application Ser. No. 07/815,924, filed Dec. 30, 1991, and international Patent Application Serial No. PCT/US92/11356, filed Dec. 30, 1992, by James T. Russell for OPTICAL RANDOM ACCESS MEMORY.

BACKGROUND OF THE INVENTION

The invention concerns method and apparatus of optically storing and retrieving mass digital data stored as light altering characteristics on an optical material and providing fast random access retrieval.

Optical memories of the type having large amounts of digital data stored by light modifying characteristics of a film or thin layer of material and accessed by optical addressing without mechanical movement have been proposed but have not resulted in wide spread commercial application. The interest in such optical recording and retrieval technology is due to its projected capability of faster retrieval of large amounts of data compared to that of existing electro-optical mechanisms such as optical discs, and magnetic storage such as tape and magnetic disc, all of which require relative motion of the storage medium.

For example, in the case of optical disc memories, it is necessary to spin the record and move a read head radially to retrieve the data, which is output in serial fashion. The serial accessing of data generally requires transfer to a buffer or solid state random access memory of a data processor in order to accommodate high speed data addressing and other data operations of modern computers. Solid state ROM and RAM can provide the relatively high access speeds that are sought, but the cost, size, and heat dissipation of such devices when expanded to relatively large data capacities limit their applications.

Examples of efforts to provide the relatively large capacity storage and fast access of an optical memory of the type that is the subject of this invention are disclosed in the patent literature such as U.S. Pat. No. 3,806,643 for PHOTOGRAPHIC RECORDS OF DIGITAL INFORMATION AND PLAYBACK SYSTEMS INCLUDING OPTICAL SCANNERS and U.S. Pat. No. 3,885,094 for OPTICAL SCANNER, both by James T. Russell; U.S. Pat. No. 3,898,005 for a HIGH DENSITY OPTICAL MEMORY MEANS EMPLOYING A MULTIPLE LENS ARRAY; U.S. Pat. No. 3,996,570 for OPTICAL MASS MEMORY; U.S. Pat. No. 3,656,120 for READ-ONLY MEMORY; U.S. Pat. No. 3,676,864 for OPTICAL MEMORY APPARATUS; U.S. Pat. No. 3,899,778 for MEANS EMPLOYING A MULTIPLE LENS ARRAY FOR READING FROM A HIGH DENSITY OPTICAL STORAGE; U.S. Pat. No. 3,765,749 for OPTICAL MEMORY STORAGE AND RETRIEVAL SYSTEM; and U.S. Pat. No. 4,663,738 for HIGH DENSITY BLOCK ORIENTED SOLID STATE OPTICAL MEMORIES. While some of these systems attempt to meet the above mentioned objectives of the present invention, they fall short in one or more respects.

For example, some of the systems proposed above have lens or other optical structure not capable of providing the requisite resolution to retrieve useful data density. The optical resolution of the data image by these prior lens systems does not result in sufficient data density and data rate to compete with other forms of memory. Although certain lens systems used in other fields such as microscope objectives are theoretically capable of the needed resolutions, such lens combinations are totally unsuited for reading data stored in closely spaced data fields. Another difficulty encountered with existing designs is the practical effect of temperature and other physical disturbances of the mechanical relationship between the data film or layer, the lens assemblies and the optical sensors that convert the optical data to electrical signals. For example, the thermal expansion effects of even moderate density optical memories of this type can cause severe misregistration between the optical data image and the read out sensors. Similar difficulties are encountered in the required registration between the recording process and the subsequent reading operations. Intervening misregistration of the high density optical components can cause significant data errors if not total loss of data.

Accordingly, it is an object of this invention to provide an optical mass memory having random accessibility in a relatively compact size comparable to or even smaller than tape and compact disc storage mechanisms and yet still serving data processing equipment in the same manner that solid state random access memories move data into and from the processor's data bus.

SUMMARY OF THE INVENTION

Data is stored in an optical data layer capable of selectively altering light such as by changeable transmissivity, reflectivity, polarization, and/or phase. In the case of a transmissive data layer, data bits are stored as transparent spots on a thin layer of material and are illuminated by controllable light sources. An array of imaging lenslets project an optically enlarged image of the illuminated data onto an array of light sensors. The layer of data is organized into a plurality of regions or patches (called pages) and by selective illumination of each data page one of the lenslets images the data page onto the array of light sensors. Transmitted page data, in this case light passed through the transparent bit locations on the data layer, strike different ones of the arrayed light sensors, thereby outputting a pattern of binary bits in the form of electrical data signals. By selectively and sequentially illuminating different ones of the data regions (pages) on the data layer, correspondingly different data patterns are imaged by the corresponding lenslets onto the same photosensor array, thereby enabling many data pages to be multiplexed at electrooptical speed onto the common photosensor array image plane.

Embodiments of data storage and retrieval systems related to the present invention are disclosed in the above-referenced copending application Ser. No. 07/815,924 as read-only devices, write-only devices, and read/write devices. In accordance with the preferred embodiment of the present invention, the pages or regions of data are arrayed in a substantially annular, planar pattern on a data layer that is in turn preferably bonded to an annular multi-surface lens array, also of annular configuration. Individual, selected data regions or pages are illuminated by a solid state emitter, such as an LED or laser diode. The lenslets of the multi-surface lens system array collect light from the data layer and direct it toward a substantially planar reflective surface that is disposed substantially parallel to and spaced from the annular data layer and annular lenslet array. The reflective surface both reflects and optically alters the light rays that are to form the data image. This reflection redirects and folds the image back toward the center of the annular lenslet and data arrays where the data page image is formed. To receive this reflected and hence folded image, a planar array of solid state sensors are positioned at an image plane in registration with a centered region of the data and lenslet arrays, preferably at a plane that is on the opposite side of the data layer from the reflector.

The optical prescriptions of the lenslet array are designed and computed in an optical system that includes the ray modifying optics of the reflector so that the data images are convergent on an imaginary axis passing through the center of the annular data and lenslet arrays. After reflection, the data image from a selected data region or page location on the data array are drawn back toward the center of the assembly to fall precisely on the sensor array. This configuration, in which the data is distributed in an annular array surrounding the centrally located sensor array together with the optically modifying reflector, provides for a compact optical memory assembly. A relatively large amount of data area or surface area for data is available for being imaged, on a selective page by page basis, onto the common centrally located sensor array, in a compact, efficient geometry. The optical distance available for imaging the data is essentially twice the height or thickness of the assembly, i.e., the distance between the data layer plane and the reflector plane.

In the preferred embodiment, the annular data layer and annular lenslets are affixed on a removable data/lenslet sandwich card that has an opening or is optically transparent at the center of the arrays. The data/lens card is removably inserted into a reader that houses the sources of light (emitter), sensor array, reflector and interface electronics. Further still, the preferred form of the lens surfaces of the data/lenslet sandwich card are diffractive with a computed prescription that takes into account the resolution requirements of the data as well as the location of the data images relative to the center of the annular arrays. The preferred optical prescription of the reflector is a diffractive surface that is embossed or otherwise imprinted on the reflective surface. The electronics that support the light emitters and sensors is preferably mounted adjacent to or integrated with, as by large scale integration (LSI), the emitters and/or sensors to provide further efficiencies and compactness in the overall product.

In the above preferred embodiment, using a diffractive element or surface on the reflector, it is necessary to incorporate significant aspheric content in the prescription in order to control the rays of the data page images depending upon the radial location on the data annulus. In an alternative disclosed embodiment, the reflector is a concaved mirror having aspheric content to control the image rays and draw them back to proper registration with the concentric sensor array.

In still a further alternative embodiment, the optically transparent center of the data/lenslet card is a refractive material. This refractive center causes the image rays originating from the outer edges of the data annulus to be drawn down at a sharper angle onto the sensor array minimizing loss of resolution or focus of outer edge data. The result is that the innermost radius of the data and lenslet arrays can be reduced, accommodating larger data pages or an increased number of data pages as well as reducing the angle of incidence of the image rays on the sensor elements. A preferred form of the invention fabricates the data layer and lenslet array as a bonded structural unit or card, much like a sandwich of different layers of material, to thereby fix the optical distances and registration of these elements. This bonded data/lenslet card structure minimizes the adverse optical effects of misalignment such as due to differential thermal expansion between the data layer and the lenslets and allows for an exceedingly dense data pattern. A further aspect of this sandwiched data and lenslet card structure is to immerse the data layer in the space adjacent the lenslets in a transparent material of select index of refraction relative to air and to the lenslet so as to control the angle of divergence of data image rays emanating from the data layer and still provide refractive power at the first surface of the lenslet. This immersion material is preferably also a structural bonding layer made of a transparent polymer described more fully below. The resulting structure can be fabricated at a relatively low per unit cost and provides an effective way of achieving the imaging power needed to faithfully form the data image onto the common photosensor array, notwithstanding the very dense, compact arrangement of the data.

Still another aspect of this preferred form of the lenslet array is that the first surface of each lenslet, i.e., adjacent the data layer, is aspherically prescribed to enhance the optical resolution of the exceedingly small and dense patch of data that is to be imaged. As indicated above, this first surface and at least one second surface of the lenslet array are preferably diffractive. The annular data layer and annular lenslet array together with the transparent immersion/bonding layer can be fabricated at a cost that allows the structure to be fabricated and effectively used as a replaceable data card.

It is therefore seen that the present invention provides an enormous data storage capability having random access speeds that approach, if not exceed, the fastest solid state RAMs and ROMs. Moreover, the organization of the data output capability of the present invention enables unusually large data words to be accessed virtually at the same instant, such as at a single clock time. Since the entire data page, when imaged on the photosensor array, conditions the array to output all of the data from that page at any given instance, the size of the output word is limited only by the number of bits in the sensor array and the addressing electronics cooperating with the sensor array. Since the array itself can be interrogated along rows and columns of data, each of which may be on the order of 1,000 bits per row or column, this allows the system of the present invention to output a data word on the order of 1,000 bits, or selected and variable portions thereof as needed. Such relatively large output words provide important applications of the present invention to such systems as computer graphics, "correlation engines" of computer based industrial systems, and other computerized or digital based systems.

These and other features, objects, and advantages of the invention will become apparent to those skilled in the art from the following detailed description and appended drawings.

DETAILED DESCRIPTION

Figure 1:
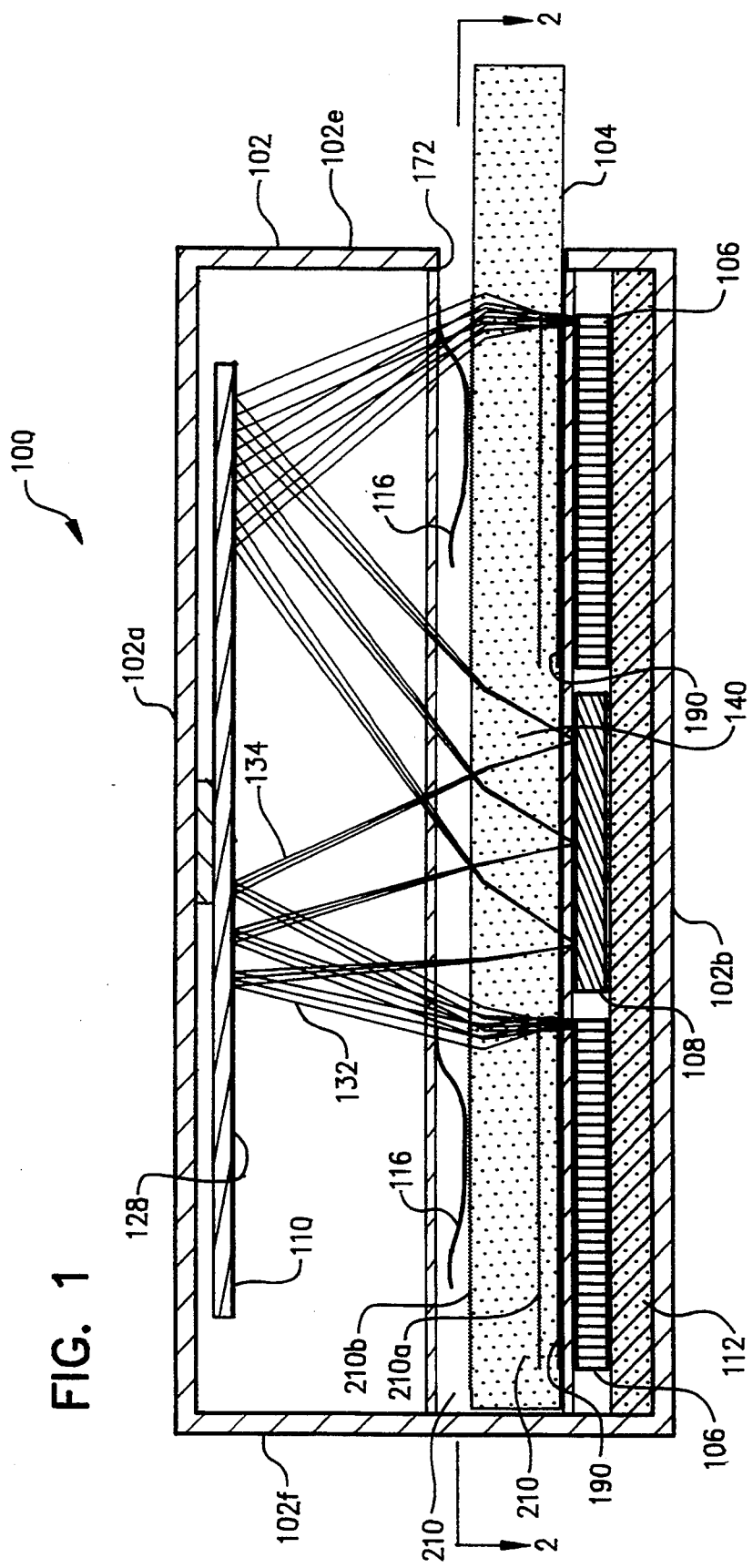
FIG. 1 is a section view taken along a vertical cutting plane of an embodiment of the optical memory having a housing for the image folding relector and arrays of emitters and sensors, and a slot for receiving a data/lens sandwich card containing the annular data and superposed lenslets.
Figure 2:
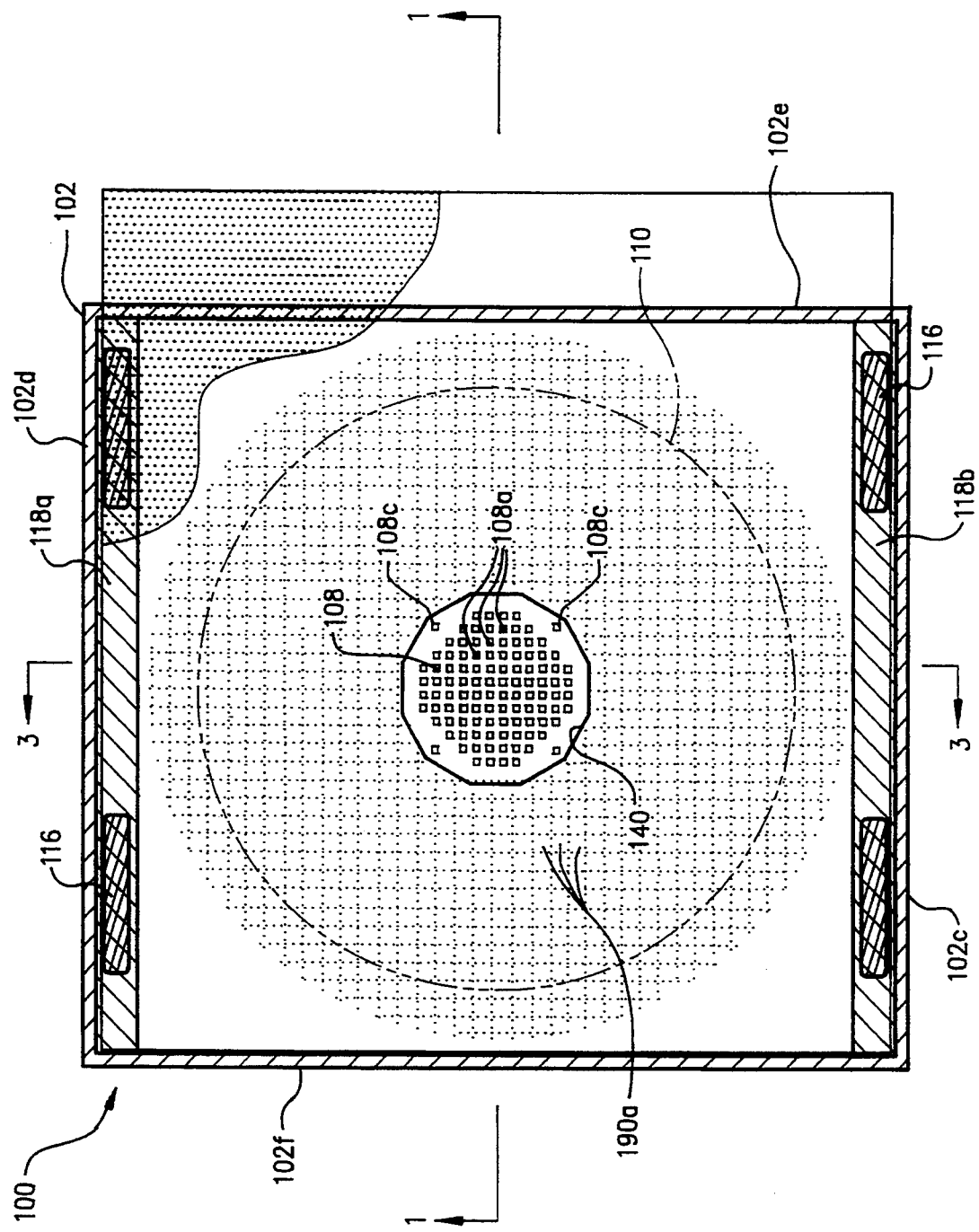
FIG. 2 is a top view taken along section lines 2—2 of the optical memory of FIG. 1.
Figure 3:
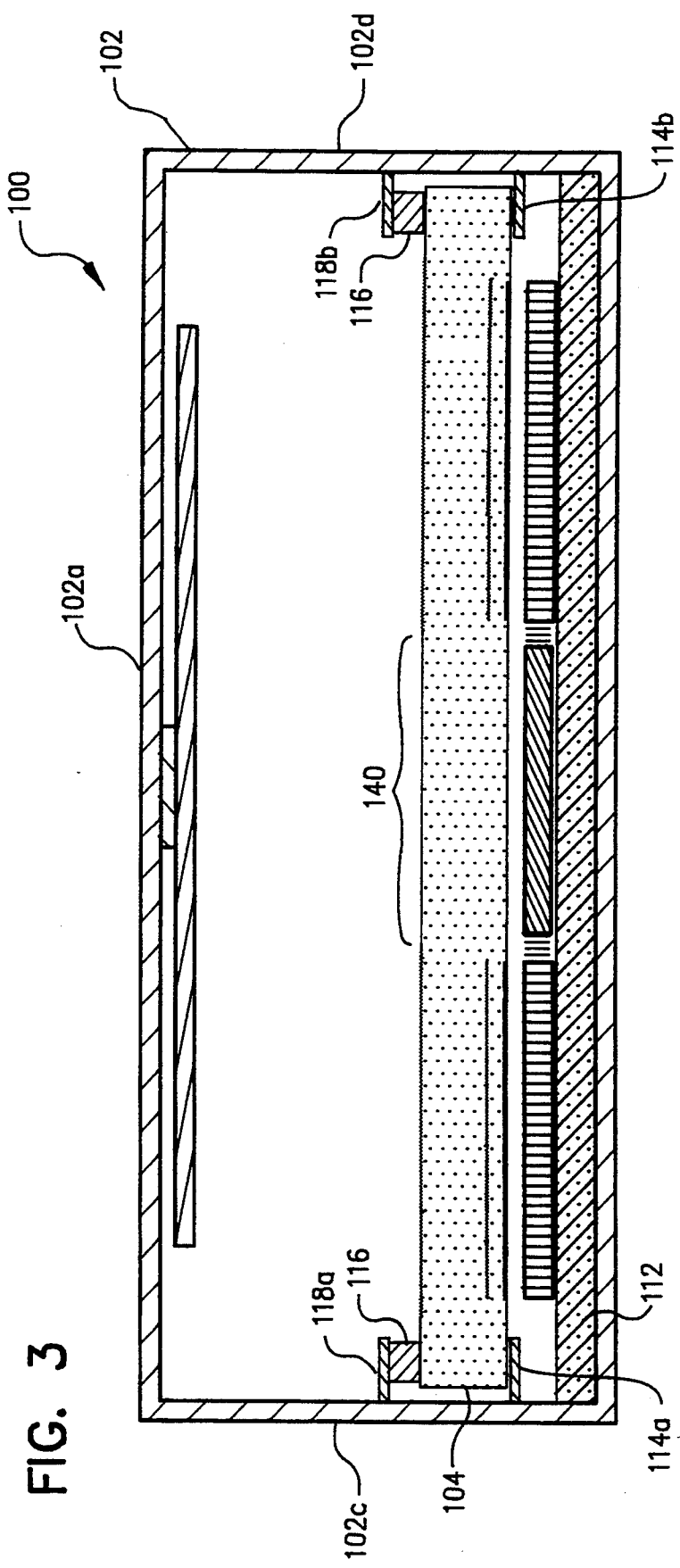
FIG. 3 is a section view taken along a vertical cutting plane 3—3 of the optical memory shown in FIG. 2.

With reference to FIGS. 1, 2 and 3, a preferred form of the optical random access memory 100 in accordance with the invention is shown to include a housing 102 of a regular polygon shape, including top and bottom walls 102a and 102b, respectively; opposing side walls 102c and 102d, and front and back walls 102e and 102f, respectively. Memory 100 includes light sources, a data/lens card, sensor array, and interface electronics that use some of the features and functions of optical memories disclosed in related copending U.S. application Ser. No. 07/815,924 and international Application Serial No. PCT/US92/11356, the published specifications of which are incorporated herein by reference. It is an aspect of the preferred embodiment of the invention that one dimension of housing 102, here the height of side, front and back walls 102c-f, be less than half the other dimensions, here the top, bottom and front-to-back depth. This aspect ratio of the overall housing 102 yields a more compact unit that is readily accommodated in the shells of existing personal and desk top computers and related devices. The compactness of the housing 102 forms a correspondingly shaped chamber in which the electronic and optical components are contained for selecting, forming and reflecting data images onto a photosensor array. A removable data/lens card 104, inserted through a slot in front housing wall 102e, disposes an annular array of data regions or pages in registration with a correspondingly shaped annular array of page selection light sources 106 mounted in housing 102 near bottom wall 102b. A central sensor array 108 is fixed in housing 102 on a common substrate that mounts the light sources 106 and associated electronics, with array 108 being positioned to receive through an open or optically transparent window in card 104, data page images sequentially selected and generated by individual ones of light sources 106, and reflected (hence folded) by a diffractive mirror 110 overlying data/lens card 104.

The annular configuration of the data/lens arrays on card 104 allows a substantial increase in data storage over other proposed configurations, and the reflective surface of mirror 110 folds the data image rays back toward the center of the data/lens annulus, where the common sensor array is positioned, to yield a compact ORAM reader. Thus with reference to the lower region of housing 102 as viewed in FIGS. 1 and 3, there is provided adjacent the interior of bottom wall 102b, an integrated circuit 112 including electronic drivers coupled by micro leads (not shown) to an annular array of solid state photoemitter elements functioning as the read light sources 106. Light sources 106 are mounted on a substrate that is provided by integrated circuit 112 to fix the sources in a close packed, dense light source pattern, such as described more fully in copending U.S. Pat. application Ser. No. 07/815,924 and international Application No. PCT/US92/11356. The array of light sources 106 in their annular pattern is thus coplanar with and supported in fixed position on integrated circuit 112.

Immediately above and parallel to light sources 106, unitary data/lens card 104 is removably installed into slotted opening 172 in housing front wall 102e. Card 104 is a layered sandwich structure including a data layer 190 of binary information bits organized in multiple data pages or regions (see FIG. 2). A complementary diffractive lens array 210 is bonded to data layer 190 and has a plurality of lenslets systems each disposed in precise, fixed optical registration with a different multi-bit data region or page. Unitary data/lens card 104 is fabricated as a bonded unit so that the array 210 of lenslet systems is fixed in spatial relation to the data layer 190. This structure enhances the integrity of the optical registration between data and imaging lenslets so that card 104 is installable and replaceable as a unit while maintaining fixed spatial data-to-lens relationship. The card 104 can thus be replaced by other similarly constructed data/lens cards containing different data on layer 190. Card 104 slides into place on edge guides 114a and 114b on opposite interior faces of housing side walls 102c and 102d that contact lower side margins of the card. To maintain proper and consistent positioning of card 104 in reader housing 102, leaf springs 116 anchored to interior side wall flanges 118a and 118b, disposed above guides 114a and 114b, push the card against guides 114a and 114b.

To further enhance the readability by sensor 108 of the light image rays emanating from data/lens structure 17, and representing a selected, illuminated data page, the image rays from each such page are passed through a lenslet system having a first and at least a second optical surface 210a and 210b. These optical lens surfaces are preferably diffractive. As described in copending U.S. and PCT applications, Ser. Nos. 07/815,924 and PCT/US92/11356, the first lens surface 210a is placed close to the data layer 190 and is aspheric to collect a maximum amount of the data field light in each page and the second diffractive surface accommodates expansion of data rays in an expansion zone larger than each of the close pack data pages where data image rays from different but adjacent pages pass through. Following diffractive lens surface 210b, the data page images originating on data layer 190, and developed by lens array 210, upon illumination by light sources 106, are reflected and further optically modified by a diffractive and reflective surface 128 on reflector 110.

The diffractive optical prescription of surface 128 functions as a field lens to distribute the image bit rays, arriving as shown at 132, from second diffractive surface 210b of the data/lens card and reflected back (i.e., folded) as shown at 134, toward the sensor 108 at the center of the data annulus. Since the image bit rays, especially from the outer region of the data annulus in layer 190, are folded to return to sensor 108 at an angle of incidence less than 90°, i.e., not normal to the sensor plane, a refractive, or it may be diffractive, image return area 140 is provided by card material in the center of the data and lens array, The reflected image rays are refracted in a manner shown in FIGS. 1 and 4 to cause the data images, especially those from the outermost data pages, to strike the sensor array at a more normal angle.

Thus by disposing the sensor 108 beneath the data card, the improved imaging due to refraction by the card's transparent center is accomplished together with the topology of a sensor 108 that is mounted on the same or a coplanar integrated circuit substrate as that which supports the light source array 106.

The data image projected onto array 108 in this preferred embodiment is generated from pages stored in a regular x-y grid pattern as shown in FIG. 2. By illuminating selected regions or pages of data layer 190, e.g., page 190a, the image, as transformed by an associated lenslet system, is enlarged, shifted radially inwardly, reflected, further modified by the optical prescription on reflector 110, and then imaged on the array of light sensing elements 108a of sensor 108. While the elements 108a may be arrayed in various suitable ways, here they are preferably in a regular x-y square sensor grid 108b with the corners lopped off to fit within the inside concentric area 140, roughly a circle or many sided polygon, as illustrated. At spaced circumferential locations adjacent grid 108b, a plurality of fiducial detectors 108c are provided, having same or similar photosensing properties as sensor elements 108a, to aid in the registration and/or reading of each data image as described in related U.S. application Ser. No. 07/815,924 and international Application Serial No. PCT/US92/11356.

The redirection of the image rays by the optical prescription of diffractive and reflective surface 128 of reflector 110 serves as a type of field lens, to collect and refocus the data page image onto sensor 108.

Thus, in operation, one of many pages of binary data is selected from annular data layer 190 by energizing a chosen cell of annular arrayed light sources 106. This causes data page light rays to emanate toward and be reflected by reflector 110 which distributes the data bit rays that become the page image to strike the arrayed photosensing elements of sensor array 108. The data page image has roughly the shape of a circle or many sided regular polygon and fills the image plane on the upper surface of sensor array 108. The individual data bits within a single data page are here arranged in closely spaced rows and columns and at densities that use to advantage high resolution optical films and other record media including but not limited to photochemical films, provided as layer 190.

As described in related U.S. application Ser. No. 07/815,924 and international Application Serial No. PCT/US92/11356, the data may be recorded onto layer 210a by photochemical processes using a page composer and imaging optics to successively expose each page or region on the data layer to a field of data light bits, by direct photographic reproduction including contact printing and/or molding or embossing from a master as in the case of conventional compact disc records. The data bits are in a size range of 2.25 to 0.5 microns and a center-to-center spacing also in that range. Each data page is formed by the amount of individual data bits that can be collected and grouped into a cell and at the preferred density range of $2 \times 10^7 - 4 \times 10^8$ bits per $cm^2$, it has been found that about $10^6$ (1 megabit) of data per page (or region) is an advantageous quantity that results in the generation of a data image after magnification that can be reliably sensed by photosensitive elements of sensor array 108. In this case, the preferred embodiment provides an optical image enlargement through the various lenslet systems and field lens effect of surface 128 of approximately 20 to 30 times data density on layer 190. Thus, assuming a mean magnification of 25×, the spacing of the projected image elements 108a on sensor array 108 is on the order of 25 microns. A multi-sided or roughly circular cell for sensing a page of data thus contains one million data bit sensor elements.

The particular structure and operation of the sensor array 108 and various alternatives to the preferred embodiment are described in greater detail in related U.S. application Ser. No. 07/815,924 and international Application Serial No. PCT/US92/11356. Briefly, each data bit which may be represented by a spot of light from the imaged page, causes a photosensitive element 108a of sensor array 108 to either conduct or nonconduct depending on whether the data is a "1" or a "0" bit. Although different forms of data layer 190 may be employed, in the present preferred embodiment data layer 190 is a light transmissive mask or film in which binary "1" bits are transmissive while binary "0" bits are opaque or light blocking.

It will thus be seen that the read elements and operation of optical memory 100 provide for accessing each of many hundreds of regions (pages) of data having, for example, one million bits per page at 1 micron bit size. Moreover, in this present invention, the magnitude of the gross data storage is greatly enhanced by configuring the data in an annular array, encircling the sensor window to allow common sensor array 108 to read any one of the surrounding data pages. Selecting a single data page from data layer 190 by energizing one cell of light sources 106 accesses an entire page of 106 bits. This data is available at the interface contained in integrated circuit 112 that underlies and supports sensor array 108, at access speeds typical of electro-optical switching, e.g., equal to or less than 50 nanoseconds. Data words that make up different portions of the entire page may be selectively addressed at circuit 112, such as a column or row of data on each accessed page, or the entire page may be output as a parallel dump. Each row or column of data within an accessed page may contain as many as one thousand data bits given the above configuration, hence making fast random retrieval of exceedingly long bit words of this magnitude within the capability of the optical memory 100.

In dimensions, a one million ($10^6$) bit page imaged on sensor array 108 will occupy a many sided polygon or circle of an area of 6.5 $cm^2$ or about 1 square inch. The data/lens annulus on card 104 with outer and inner radii of 2.5 cm and 0.85 cm respectively, provides at the above stated preferred density range of $2 \times 10^7 - 4 \times 10^8$ bits per $cm^2$, an area of 17.30 $cm^2$ (about 2.6 square inches). This area contains as many as 1664 patches or pages of data, each patch or data page being almost instantaneously selectable ($\leq 50$ nanoseconds) and retrievable by the high speed switching capabilities of electro-optical and electronic addressing devices. In effect, the multiple pages of data bits are multiplexed onto the image plane at sensor array 108 by electronic switching of read light sources 106. The output data are available in the above-mentioned form for direct application to a processor data bus.

Figure 4:
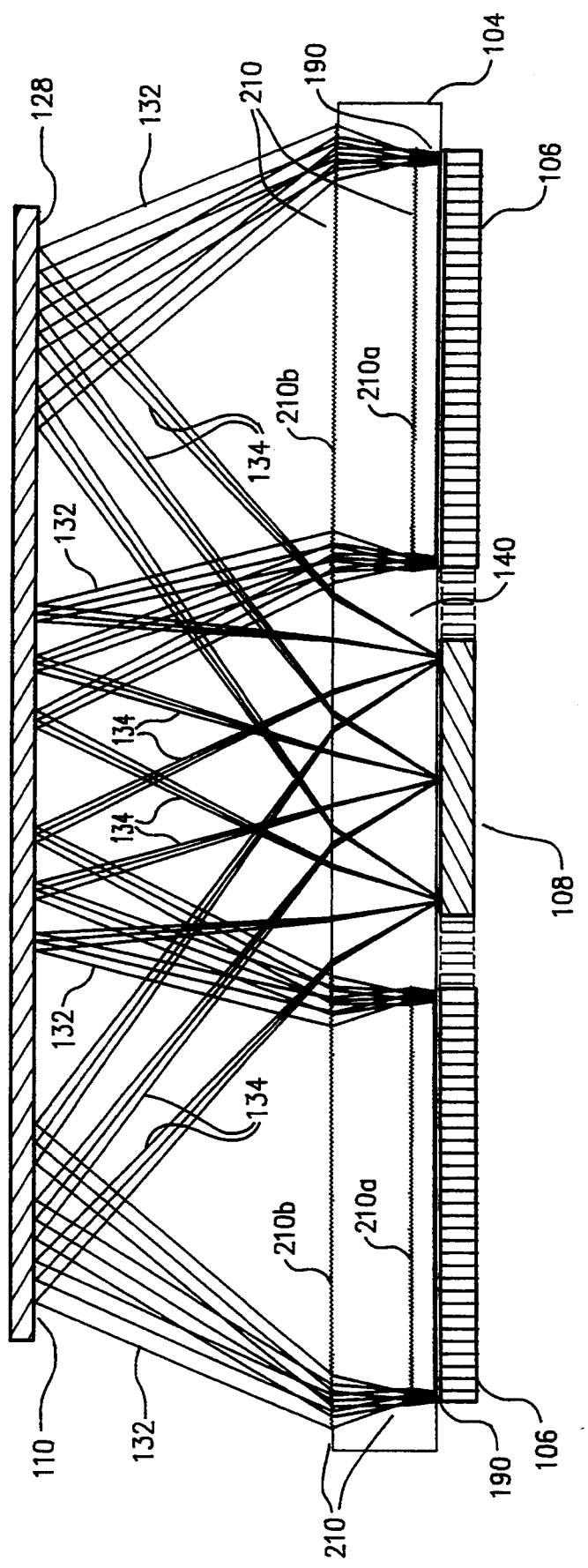
FIG. 4 is a diagrammatic view of the principal elements of the optical memory of FIGS. 1-3, removed from the housing and illustrating the various travel paths of the data image rays.

In FIG. 4, the essential elements of the folded image ORAM 100 are shown without housing 102. The data page images are selectively redirected (as diagrammatically indicated) by the field-like optical diffractive surface 128 of reflector 110 so that the radial innermost to outermost regions (pages) of data layer 190 are reflected and focused onto the common central sensor array 108. Since the sensor removes some of the area on layer 190 that would otherwise be available for data, the chapter size can be increased to make up for the loss. If the chapter is made bigger yet to make more efficient use of the sensor, such increases mean a longer optical path for the pages on the extreme edge of the annulus, meaning an increase in magnification. In addition, the angle that the bundles make at the sensor is larger, which tends to elongate the bit image in one dimension so that a single light bit of the image may, without further design constraints, overlap onto the adjacent sensor elements of array 108.

There are various innovations that enable ORAM 100 to overcome the above aspects of this configuration. First, reflector 110 has a diffractive optical element on surface 128. This element is slightly aspheric and examples of the prescription are set forth below. The mirror and aspheric diffractive element combination reflects the image light and acts as part of the field lens function in combination with the page lenslet systems. Because of the aspheric component on reflector surface 128, beams from the outer pages are effectively focused on the radially inward sensor array 108. This additional focusing means that the bundles of image rays from the radially outer pages of layer 190 are collimated by the lenslet system 210, thus the extra distance of the radially outer data pages relative to those radially inward, does not contribute to the image magnification.

Secondly, ORAM 100 uses a solid refractive window 140 in the sandwich of card 104. Solid window 140 refracts the inner edge beams so that more pages can be added to the inside of the annulus. The window 140 also refracts the outer originating beams, reducing the incidence of angle of the extreme rays at the sensor array 108. Optionally, a relatively high index cover on array 108 can be used to further reduce the incidence of angle of extreme image rays.

Thirdly, array 108 is substantially coplanar with sources 106 so that both are formed on the same substrate or substructure. This means that all electronics can be placed on one structure that is preferably a large scale integration.

In the particular embodiments of FIGS. 1–4, the major radius of the data pages in layer 190 is about 25 mm, and the minor radius of the annulus about 8.5 mm. The sensor is about 10 mm diameter. This provides about five times as many pages as would have been the case without an imaging folding mirror, but with the same height. Alternatively, the height is about half what it would have been for the same data chapter size, collectively all pages.

In either the diffractive reflector of FIGS. 1–4, or the contoured mirror of FIG. 5, each of the various lens and reflective surfaces are computed for optimum prescription, as shown in the following exemplary tables.

TABLE

EXAMPLES OF LENS AND REFLECTOR PRESCRIPTIONS FOR ORAM 100

*LENS DATA
Folded System, 25 mm offset

| SRF | RADIUS | THICKNESS | APERTURE RADIUS | GLASS | NOTE |
|---|---|---|---|---|---|
| 0 | — | 0.100000 | 0.200000 | ULTEM | Data plane |
| 1 | — | 0.822159 | 0.260000 | ULTEM | dcy |
| 2 | — | — | 0.260000 | ULTEN | dfx |
| 3 | — | 1.182207 | 0.260000 | ACRYLIC | dfr |
| 4 | — | 2.140722 | 1.000000 A | ACRYLIC | dcy |
| 5 | — | — | 1.000000 | ACRYLIC | dfr |
| 6 | — | 0.200000 | 1.000000 | AIR | dfx |
| 7 | — | 12.000000 | 10.000000 | AIR | dcy offset |
| 8 | — | — | 10.000000 | AIR | dfr refl |
| 9 | — | — | 10.000000 | REFLECT | Mirror |
| 10 | — | −12.220000 | 10.000000 | AIR | |
| 11 | — | −4.300000 | 7.000000 | ACRYLIC | Window |
| 12 | — | −0.100000 | 7.000000 | AIR | |
| 13 | — | −0.100000 | 5.000000 | BK7 | Sensor plane |
| 14 | — | — | 5.000000 | | |

*DIFFRACTIVE SURFACE DATA

| 2 | DOE DFX | 4 | DOR 1 | | DWV | 0.645000 | | |
|---|---|---|---|---|---|---|---|---|
| | DF2 | 1.8181e-05 | DF3 | 0.118156 | DF4 | −0.000887 | DF5 | 0.129276 |
| | DF6 | 0.002617 | DF7 | −0.017191 | DF8 | −0.000274 | DF9 | −0.010582 |
| | DF10 | −0.000631 | DF11 | −0.018001 | | | | |
| 3 | DOE DFR | 10 | DOR 1 | | DWV | 0.645000 | | |
| | DF1 | −0.580847 | D72 | 0.038308 | DF3 | −0.044406 | DF4 | 0.113964 |
| 5 | DOE DFR | 6 | DOR 1 | | DWV | 0.645000 | | |
| | DF1 | −0.161999 | DF2 | 0.004165 | DF3 | −7.6560e-05 | | |
| 6 | DOE DFX | 4 | DOR 1 | | DWV | 0.645000 | | |
| | DF2 | 0.451901 | DF3 | 0.006021 | DF5 | 0.024102 | DF6 | −0.000324 |
| | DF7 | 0.003690 | DF9 | 0.002165 | DF10 | 0.000187 | | |
| 8 | DOE DFR | 6 | DOR −1 | | DWV | 0.645000 | | |
| | DF1 | 0.005091 | DF2 | 5.1267e-06 | | | | |

*TILT/DECENTER DATA

| 1 | DT | 1 | DCX | — | DCY | −0.094552 | | |
|---|---|---|---|---|---|---|---|---|
| | | | TLA | — | TLB | — | TLC | — |
| 4 | DT | 1 | DCX | — | DCY | 0.207067 | | |

TABLE-continued

EXAMPLES OF LENS AND REFLECTOR PRESCRIPTIONS FOR ORAM 100

| 7 | DT | 1 | TLA<br>DCX<br>TLA | —<br>—<br>— | TLB<br>DCY<br>TLB | —<br>25.000000<br>— | TLC<br>TLC | —<br>— |
|---|---|---|---|---|---|---|---|---|

*PARAXIAL SETUP OF LENS

| APERTURE | Object num. aperture: | 0.405826 |
|---|---|---|
| FIELD | Object height: | −0.200000 |

*REFRACTIVE INDICES

| GLASS | RN1 | RN2 | RN3 | VNBR |
|---|---|---|---|---|
| ULTEM | 1.650783 | 1.652245 | 1.649365 | 225.975134 |
| ACRYLIC | 1.488490 | 1.488924 | 1.488069 | 571.701364 |
| BK7 | 1.514682 | 1.515014 | 1.514363 | 789.776603 |

These tables describe a lens set prescription and reflector that would be effective for a page at the outer edge of the record element. This is the optically most difficult location. Preferably, data pages that are closer to the center should have revised prescriptions for the lenses, computed using a conventional lens design program such as the one mentioned below, and inputting the radial offsets for the interior lenslets. The spacings and the reflector remain the same.

A commercial lens design program called OSLO6 was used to do the design shown in the table. The program is a product of Sinclair Optics, Inc., Fairport, N.Y.

Figure 5:
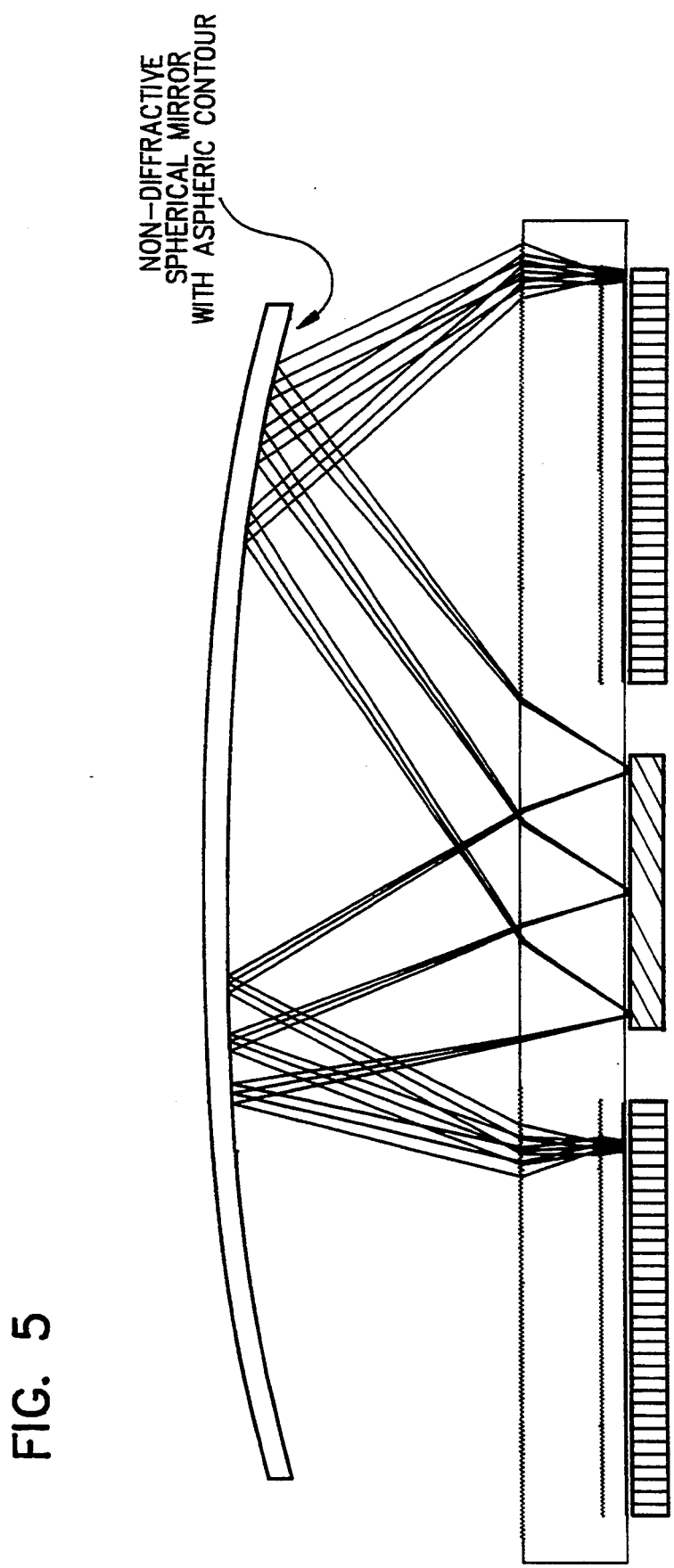
FIG. 5 is a diagrammatic view similar to FIG. 4 showing an alternative embodiment of the optical memory of the invention.

In FIG. 5, the mirror alternatively is a conventional concave "spherical" mirror with an aspheric component to the curvature. The resulting field redirection of rays is essentially the same and may have an efficiency advantage in certain applications but is more expensive to manufacture.

Figure 6:
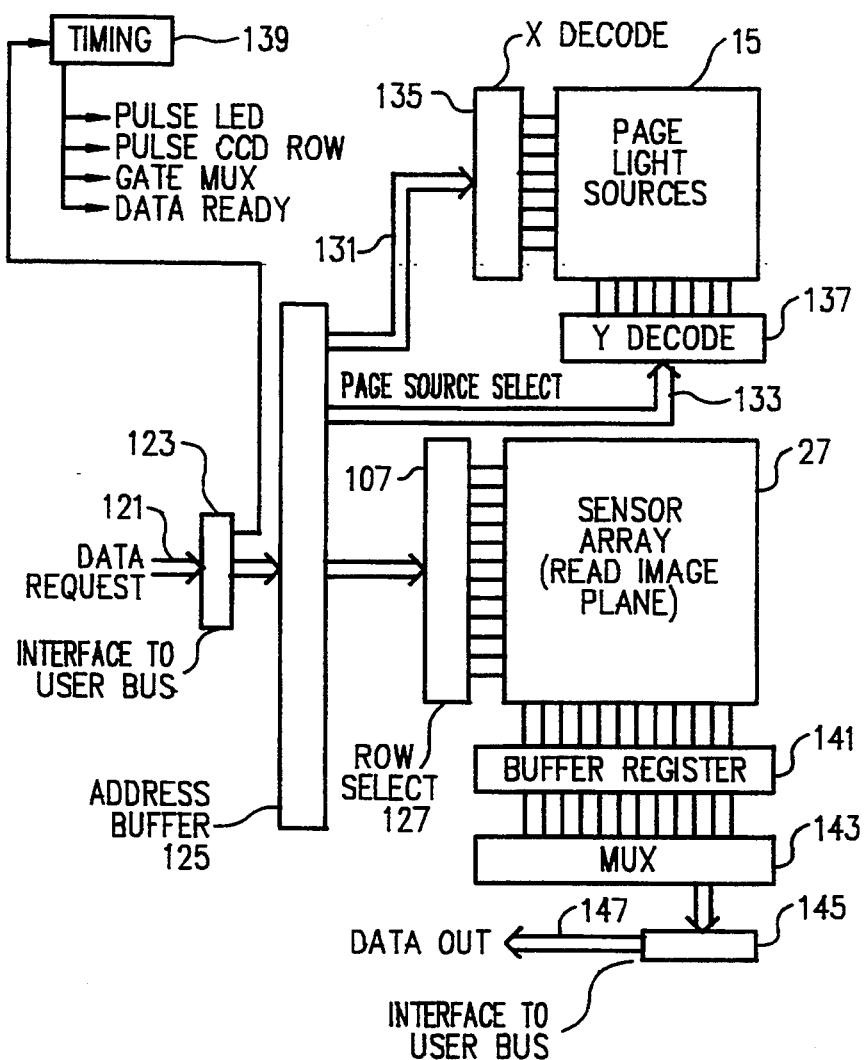
FIGS. 6 is a block diagram of the data read addressing and control electronics associated with the optical memory of FIGS. 1-5.

FIG. 6 shows the read electronics, which may be integrated into flat substrate of circuit 112 (see FIG. 1), for accessing data from ORAM 100. The configuration and operation of the read electronics are described in related applications Ser. No. 07/815,924 and Serial No. PCT/US92/11356, and briefly this involves addressing data from a data bus 121 connected via an interface bus 123 through an address buffer 125 to select particular rows of data after an image has been formed on sensor array 108. This is done by operating row select switches 127. To illuminate a selected data page, the address available from bus 121 includes page address data fed over X and Y decode buses 131 and 133 which cause X decode 135 and Y decode 137 to select a particular one of the multiple light sources 106 to illuminate a single page of data for imaging onto sensor array 27. A timing control 139 provides in a manner known per se, a sequence of timing control signals identified as "pulse LED" (controls page light sources 106); "pulse CCD row" (controls the read-out of data from a charge coupled device sensor array 108); "gate MUX" (controls an output multiplexer from sensor array 108); and "data ready" (signals that the data is ready from the data output multiplexer and interface to a data user bus). The output of data from sensor array 108 is made available through a buffer register 141, a multiplexer 143, an interface to bus 145, and an output data bus 147.

Figure 7:
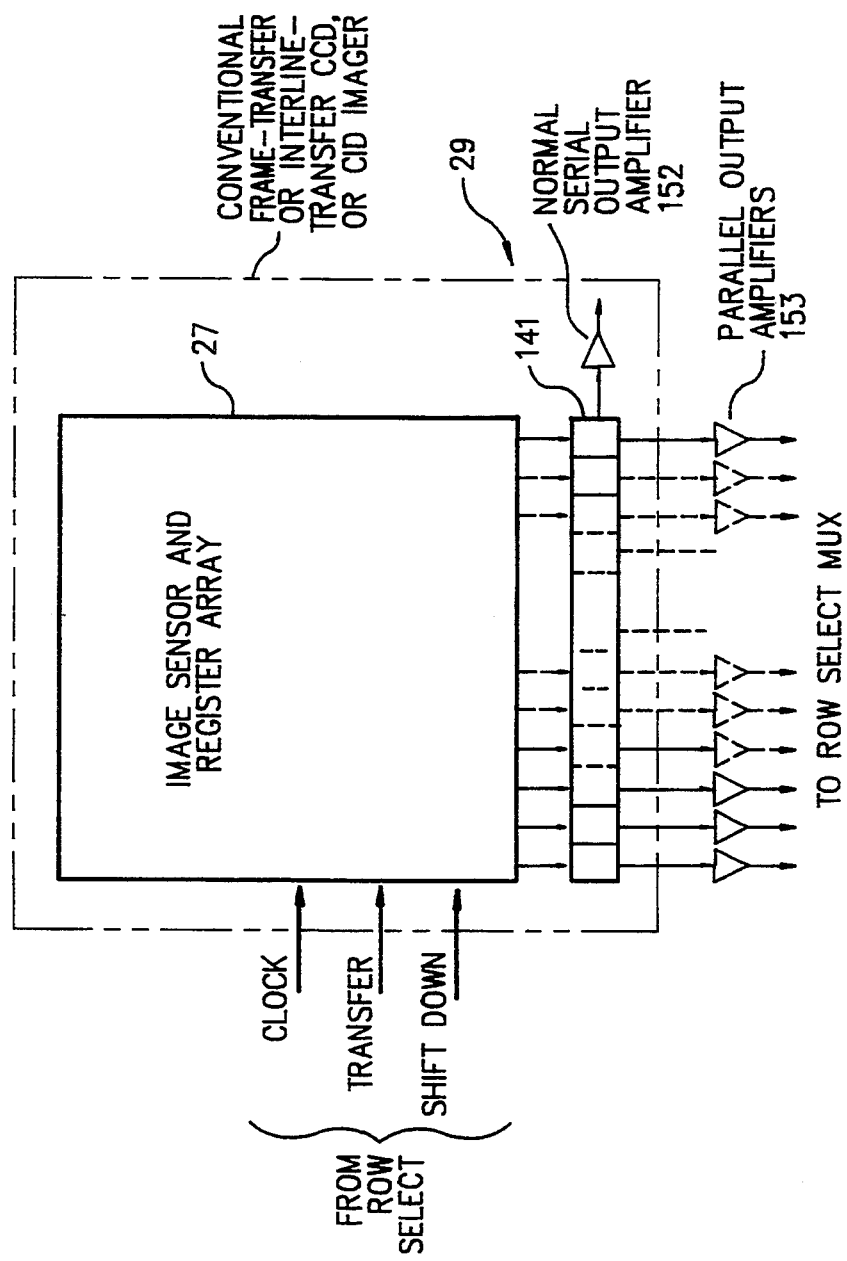
FIG. 7 is a schematic diagram of the preferred embodiment of the sensor array and associated electronics of the optical memories of FIGS. 1-5.

FIG. 7 shows a suitable construction of sensor array 108, including the capability of discriminating against spurious overlapping light falling on sensor elements that are not incident with "true" bit image rays. The configuration and operation are described in related U.S. application Ser. No. 07/815,924 and international Application Serial No. PCT/US92/11356.

While only particular embodiments have been disclosed herein, it will be readily apparent to persons skilled in the art that numerous changes and modifications can be made thereto, including the use of equivalent means, devices, and method steps without departing from the spirit of the invention.

I claim:

1. An optical data system comprising:
    an optical data means for storing data as light altering characteristics and being organized into a plurality (P) of juxtaposed data regions each having capacity to store (B) bits of data;
    controllable light source means for selectively illuminating at least one of said juxtaposed data regions of said optical data means;
    data imaging lens means arranged in such proximity to and in optical registration with said juxtaposed data regions so that the image resolving power of said data imaging lens means is substantially uniform over the field of view of each said data region;
    sensor means having a plurality (S) of juxtaposed light sensors arranged at a common image surface for sensing data as a light image corresponding to one of said selectively illuminated data region;
    reflective optical surface means disposed in an optical path between said data imaging lens means and said common image surface for reflectively redirecting said light image onto said sensor means at said common image surface; and
    data signal output means coupled to said sensor means for outputting data signals representing said data of an illuminated and imaged data region.

2. The optical data system of claim 1 wherein said reflective optical surface means comprises an optical prescription for selectively redirecting data image bits within each data region onto said common image surface.

3. The optical data system of claim 1 wherein said reflective optical surface means has a non-planar contour to provide said prescription.

4. The optical data system of claim 1, wherein said reflective optical surface means comprises a diffractive optical surface to provide said prescription means.

5. The optical data system of claim 1 wherein said reflective optical surface means has an optical prescription that has a combination of spherical and aspherical attributes.

6. The optical data system of claim 1 wherein said controllable light source means and said sensor means are mounted on a common planar source-sensor structure, and said juxtaposed data regions and said data imaging lens means are mounted in a substantially planar data-lens structure that is removably disposed in parallel with and between said common planar source-sensor structure and said reflective optical surface means.

7. The optical data system of claim 6 wherein said data regions are arrayed in an annular planar pattern on said substantially planar data-lens structure that defines a light transmissive window at the center of said annular planar pattern, and wherein said planar data-lens structure is removably disposed relative to said source-sensor structure so that said sensor means is located in a plane parallel to said data regions in substantial registration with said light transmissive window.

8. The optical data system of claim 1 wherein said data imaging lens means comprises at least one diffractive surface, and wherein said reflective optical surface means is also diffractive.

9. The optical data system of claim 1 wherein said data imaging lens means comprises at least first and second diffractive surfaces, and said reflective optical surface means is also diffractive.

10. An optical data system comprising:
a substantially planar optical data means for storing data as light altering characteristics and being organized into a plurality (P) of juxtaposed data regions each having capacity to store (B) bits of data and arrayed in a planar annular pattern having a light transmissive window at the center of said annular pattern;

controllable light source means disposed proximate a first side of said planar optical data means for selectively illuminating at least one of said juxtaposed data regions of said optical data means;

data imaging lens means arranged in such proximity to and in optical registration with said juxtaposed data regions so that the image resolving power thereof is substantially uniform over the field of view of that data region to form an image thereof on a common image surface;

a reflective optical surface disposed generally parallel to said planar optical data means spaced from the second side thereof for reflecting a data image of each of said data regions back and inwardly toward said center of said annular pattern;

sensor means having a plurality (S) of juxtaposed light sensors arranged proximate said planar optical data means in registration with said transmissive window to provide said common image surface for sensing data as a light image corresponding to an illuminated data region; and data signal output means coupled to said sensor means for outputting data signals representing said data of an illuminated and imaged data region.

* * * * *